US008721074B2

(12) United States Patent
Pugh et al.

(10) Patent No.: US 8,721,074 B2
(45) Date of Patent: May 13, 2014

(54) ELECTRICAL INTERCONNECTS IN AN ELECTRONIC CONTACT LENS

(75) Inventors: Randall Braxton Pugh, St. Johns, FL (US); Adam Toner, Jacksonville, FL (US); Praveen Pandojirao-S, Jacksonville, FL (US); James Daniel Riall, St. Johns, FL (US); Daniel B. Otts, Fruit Cove, FL (US); Edward Kernick, Jacksonville, FL (US)

(73) Assignee: Johnson & Johnson Vision Care, Inc., Jacksonville, FL (US)

( * ) Notice: Subject to any disclaimer, the term of this patent is extended or adjusted under 35 U.S.C. 154(b) by 32 days.

(21) Appl. No.: 13/482,094

(22) Filed: May 29, 2012

(65) Prior Publication Data

US 2013/0135578 A1 May 30, 2013

Related U.S. Application Data

(60) Provisional application No. 61/564,922, filed on Nov. 30, 2011.

(51) Int. Cl.
*G02C 7/08* (2006.01)
(52) U.S. Cl.
USPC ............... 351/159.39; 351/159.03; 359/245; 359/254; 359/315

(58) Field of Classification Search
USPC .................. 351/159.03, 159.39; 359/315
See application file for complete search history.

(56) References Cited

U.S. PATENT DOCUMENTS

| 5,712,721 A * | 1/1998 | Large ........................... 359/245 |
| 2009/0204207 A1* | 8/2009 | Blum et al. .................... 623/4.1 |
| 2009/0279050 A1 | 11/2009 | McGinn et al. |
| 2010/0076553 A1* | 3/2010 | Pugh et al. .................... 623/6.22 |
| 2010/0103368 A1* | 4/2010 | Amirparviz et al. .......... 351/158 |

OTHER PUBLICATIONS

Search Report issued by the Hungarian Intellectual Property Office for Patent Application No. SG201208662-5 dated Nov. 6, 2013.

* cited by examiner

*Primary Examiner* — Evelyn A Lester
*Assistant Examiner* — William Alexander
(74) *Attorney, Agent, or Firm* — Carl J. Evens

(57) ABSTRACT

Ophthalmic lenses, including contact lenses may be enhanced through the incorporation of both active and passive electrical components. Electrical interconnects and die attachment configurations are required to ensure electrical connectivity between the components and the optic portion of the lens as well as providing a means for mounting planar devices on spherical surfaces. Electrical interconnects and die attachment for powered ophthalmic devices, including contact lenses includes realizing conductive traces on optical plastic, attaching planar dies to spherical surfaces and underfilling, overmolding and light blocking to complete the lens.

13 Claims, 5 Drawing Sheets

ELECTRICAL INTERCONNECTS IN AN ELECTRONIC CONTACT LENS

CROSS-REFERENCE TO RELATED APPLICATIONS

This patent application claims the benefit of U.S. Provisional Patent Application Ser. No. 61/564,922 filed on Nov. 30, 2011.

BACKGROUND OF THE INVENTION

1. Field of the Invention

The present invention relates to contact lenses, and more particularly to an electronic contact lens to correct and/or enhance vision, or to otherwise perform a useful ophthalmic function. The electronic contact lens comprises an optics component and an electronic component which are operatively associated with each other via electrical and mechanical structures. The electronic component itself may comprise multiple components which are also electrically and mechanically interconnected.

2. Discussion of the Related Art

As electronic devices continue to be miniaturized, it is becoming increasingly more likely to create wearable or embeddable microelectronic devices for a variety of uses. Such uses may include monitoring aspects of body chemistry, administering controlled dosages of medications or therapeutic agents via various mechanisms, including automatically, in response to measurements, or in response to external control signals, and augmenting the performance of organs or tissues. Examples of such devices include glucose infusion pumps, pacemakers, defibrillators, ventricular assist devices and neurostimulators. A new, particularly useful field of application is in ophthalmic wearable lenses and contact lenses. For example, a wearable lens may incorporate a lens assembly having an electronically adjustable focus to augment or enhance performance of the eye. In another example, either with or without adjustable focus, a wearable contact lens may incorporate electronic sensors to detect concentrations of particular chemicals in the precorneal (tear) film. The use of embedded electronics in a lens assembly introduces a potential requirement for communication with the electronics, for a method of powering and/or re-energizing the electronics and for interconnecting the electronics.

The human eye has the ability to discern millions of colors, the ability to adjust easily to shifting light conditions, and transmit signals or information to the brain at a rate exceeding that of a high speed internet connection. Lenses, such as contact lenses and intraocular lenses, currently are utilized to correct vision defects such as myopia, hyperopia and astigmatism. However, properly designed lenses incorporating additional components may be utilized to enhance vision as well as to correct vision defects.

Conventional contact lenses are polymeric structures with specific shapes to correct various vision problems as briefly set forth above. To achieve enhanced functionality, various circuits and components have to be integrated into these polymeric structures. For example, control circuits, microprocessors, communication devices, power supplies, sensors, actuators, light emitting diodes, photo sensors, energy harvesters and miniature antennas may be integrated into contact lenses via custom built optoelectronic components to not only correct vision, but to enhance vision as well as provide additional functionality as is explained herein. Electronic and/or powered contract lenses may be designed to provide enhanced vision via zoom-in and zoom-out capabilities or just simply modifying the refractive capabilities of the lenses. Electronic and/or powered contact lenses may be designed to enhance color and resolution, to display textural information, to translate speech into captions in real time, to offer visual cues from a navigation system, to provide image processing and internet access. The lenses may be designed to allow the wearer to see in low light or no light conditions. The properly designed electronics and/or arrangement of electronics on lenses may allow for projecting an image onto the retina, for example, without a variable focus optic lens, provide novelty image displays and even provide wakeup alerts. Alternately, or in addition to any of these functions or similar functions, the contact lenses may incorporate components for the noninvasive monitoring of the wearer's biomarkers and health indicators. For example, sensors built into the lenses may allow a diabetic patient to keep tabs on blood sugar levels by analyzing components of the tear film without the need for drawing blood. In addition, an appropriately configured lens may incorporate sensors for monitoring cholesterol, sodium and potassium levels as well as other biological markers. This coupled with a wireless data transmitter could allow a physician to have almost immediate access to a patient's blood chemistry without the need for the patient to waste time getting to a laboratory and having blood drawn.

The proper combination of devices could yield potentially unlimited functionality; however, there are a number of difficulties associated with the incorporation of extra components on a piece of optical grade polymer. In general, it is difficult to manufacture such components directly on the lens for a number of reasons, as well as mounting and interconnecting planar devices on a non-planar surface. It is also difficult to manufacture to scale and form. The components to be placed on or in the lens need to be miniaturized and integrated onto just 1.5 square centimeters of a transparent polymer while protecting the components from the liquid environment on the eye. It is also difficult to make a contact lens comfortable and safe for the wearer with the added thickness of additional components.

Given the area and volume constraints of an ophthalmic device such as a contact lens, and the environment in which it is to be utilized, the physical realization of the device must overcome a number of problems, including mounting and interconnecting a number of electronic components on a non-planar surface, the bulk of which comprises optic plastic. Accordingly, there exists a need for providing a mechanically and electrically robust electronic contact lens.

SUMMARY OF THE INVENTION

The electrical interconnects and mechanical structures of the present invention overcome the difficulties as briefly set forth above.

In accordance with one aspect, the present invention is directed to an ophthalmic lens assembly. The lens assembly comprising a non-planar substrate, a lens section formed on the non-planar substrate, and one or more electronic components cooperatively associated with the lens section and mounted on the non-planar substrate, wherein one of the non-planar substrate and the one or more electronic components comprise mechanical mounting structures and electrical interconnect structures for mounting the one or more electronic components to the non-planar substrate.

The present invention is directed to the mechanical and electrical modifications to ophthalmic devices, for example, contact lenses necessary to accommodate the incorporation of any number of electronic/electro-optic devices. The present invention is directed to various means, including raised structures on or in the lens that facilitate the mounting of planar structures on the non-planar or spherical surface of the lens. The present invention is directed to the various means for interconnecting the various components that comprise an electronic or powered contact lens, including the incorporation of metalized or otherwise electrically conductive traces into the optic polymer as well as creating through-hole vias so that multiple surfaces or layers may be utilized. The present invention is directed to the various means and methods to manufacture contact lenses with these additional elements and/or components safely and inexpensively.

The mechanical and electrical modifications in accordance with the present invention may be safely and inexpensively incorporated into any suitable contact lenses, including daily wear soft contact lenses, daily disposable contact lenses and rigid gas permeable hard contact lenses without the wearer experiencing any appreciable difference in comfort and/or wearability. The expense of any such contact lens will be a function of the functionality offered by the lens. For example, increased functionality typically leads to higher cost.

The mechanical and electrical modifications in accordance with the present invention provides for the attachment of semiconductor dies to a molded plastic, optical, spherical substrate with electrical connections between one or more dies, components and an electrically controlled/variable optic lens or a component that may perform a useful ophthalmic function. The modifications are compatible with current contact lens manufacturing and are intended for low cost, high volume production. The modifications are designed for the environment in which they are to be utilized.

BRIEF DESCRIPTION OF THE DRAWINGS

The foregoing and other features and advantages of the invention will be apparent from the following, more particular description of preferred embodiments of the invention, as illustrated in the accompanying drawings.

DETAILED DESCRIPTION OF THE PREFERRED EMBODIMENTS

Currently available contact lenses remain a cost effective means for vision correction. The thin plastic lenses fit over the cornea of the eye to correct vision defects, including myopia or nearsightedness, hyperopia or farsightedness, astigmatism, i.e. asphericity in the cornea, and presbyopia i.e. the loss of the ability of the crystalline lens to accommodate. Contact lenses are available in a variety of forms and are made of a variety of materials to provide different functionality. Daily wear soft contact lenses are typically made from soft polymer-plastic materials combined with water for oxygen permeability. Daily wear soft contact lenses may be daily disposable or extended wear disposable. Daily disposable contact lenses are usually worn for a single day and then thrown away, while extended wear disposable contact lenses are usually worn for a period of up to thirty days. Colored soft contact lenses use different materials to provide different functionality. For example, a visibility tint contact lens uses a light tint to aid the wearer in locating a dropped contact lens, enhancement tint contact lenses have a translucent tint that is meant to enhance one's natural eye color, the color tint contact lens comprises a darker, opaque tint meant to change one's eye color, and the light filtering tint contact lens functions to enhance certain colors while muting others. Rigid gas permeable hard contact lenses are made from silicone polymers but are more rigid than soft contact lenses and thus hold their shape and are more durable. Bifocal contact lenses are designed specifically for patients with presbyopia and are available in both soft and rigid varieties. Toric contact lenses are designed specifically for patients with astigmatism and are also available in both soft and rigid varieties. Combination lenses combining different aspects of the above are also available, for example, hybrid contact lenses.

The powered or electronic contact lens of the present invention comprises the necessary elements to correct and/or enhance the vision of patients with one or more of the above described vision defects or otherwise perform a useful ophthalmic function. In addition, they may be utilized simply to enhance normal vision or provide a wide variety of functionality as described above. The electronic contact lens may comprise a variable focus optic lens, an assembled front optic embedded into a contact lens or just simply embedding electronics without a lens for any suitable functionality. The electronic lens of the present invention may be incorporated into any number of contact lenses as described above. However, for ease of explanation, the disclosure will focus on an electronic contact lens to correct vision defects intended for single-use daily disposability.

Figure 1:
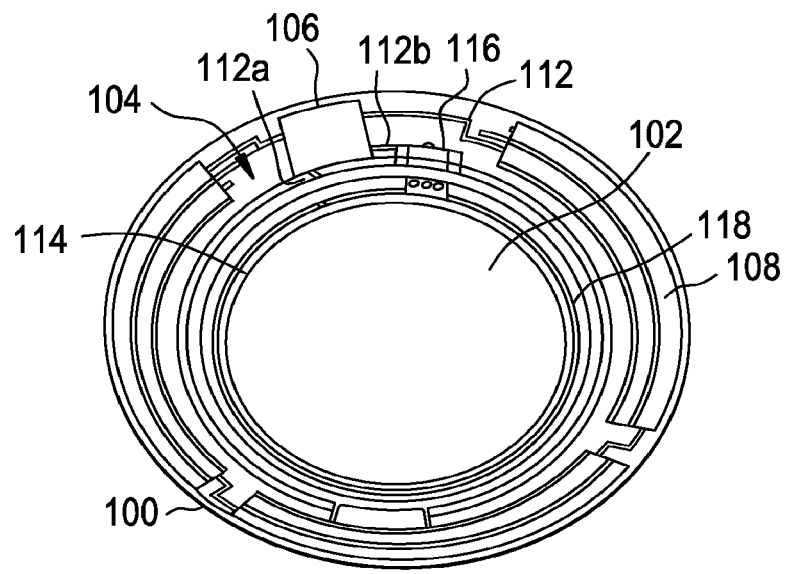
FIG. 1 is a diagrammatic representation of a contact lens comprising both optics and electronics in accordance with the present invention.

Referring now to FIG. 1, there is illustrated a contact lens 100 that comprises both optical and electronic components such that electrical and mechanical interconnects are required. The contact lens 100 comprises an optic zone 102 which may or may not be functional to provide vision correction and/or enhancement as briefly described above, or alternately, it may simply serve as a substrate for the embedded electronics for any suitable functionality. In the illustrated exemplary embodiment, the polymer/plastic forming the optic zone 102 is extended such that it forms a substrate 104 upon which the electronics are attached. Electronic components such as semiconductor die 106 and batteries 108 connect both mechanically and electrically to the substrate 104. Conductive traces 112 electrically interconnect the electronic components 106 and 108 on the substrate 104. In the exemplary embodiment illustrated, conductive trace 112a connects semiconductor die 106 to the front optic electrode 114, and conductive trace 112b connects semiconductor die 106 to the back optical electrode 116. An adhesive layer 118 may be utilized to connect the front and back optics; however, any other suitable means for joining the two layers may be utilized or the design may only utilize a single layer.

The optic zone 102 of the contact lens 100 may be of a spherical design to optimize the fit of the contact lens 100 on the eye and in the contact lens envelope. Accordingly, when connecting the optics to planer components such as the semiconductor die 106, it may be necessary to present a planer interconnect surface to the die. This may be accomplished through features on the substrate 104 and/or the die 106 as is explained subsequently.

Figure 2:
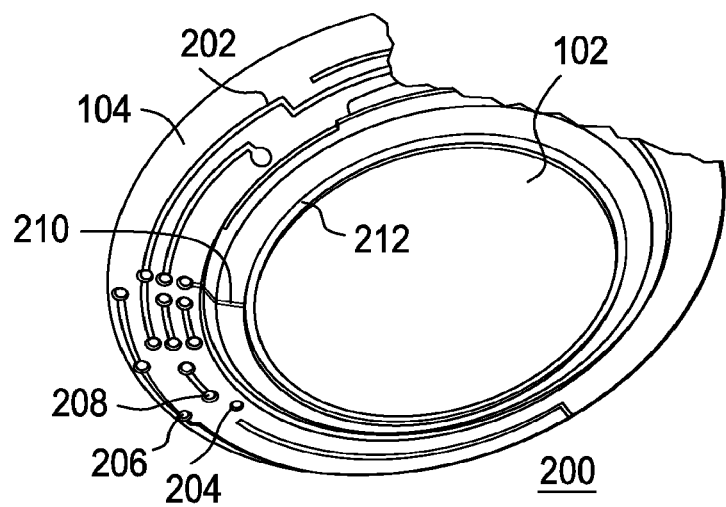
FIG. 2 is a diagrammatic representation of a first exemplary embodiment of conductive traces on an optic substrate in accordance with the present invention.

FIG. 2 illustrates a first exemplary substrate 200 which has been manufactured and metalized for mechanical and electrical interconnects without any of the electrical or electronic components attached thereto. Essentially, FIG. 2 illustrates the optics 102 and substrate 104 portions of the contact lens 100 of FIG. 1 in greater detail and with an emphasis on the conductive traces 112 without the electronics, and redrawn as conductive trace 202. Standoffs 204, 206 and 208 are structures formed on the substrate 200 and may be realized using molding and/or machining techniques on the optic plastic as is known in the relevant art. Standoffs 206 and 208 are metalized and will electrically connect to corresponding bondpads, solder balls, or other interconnected structures on a die (not illustrated). Standoff 204 is not metalized and may simply serve as a mechanical support forming a three-point planar contact in conjunction with standoffs 206 and 208 for the die. In addition to allowing electrical connection and planar mechanical support for the die, the standoffs allow clearance between the die and the substrate which is useful for underfilling, a technique known in the relevant art, which improves die adhesion and interconnect reliability. The metalized lens substrate 200 may also comprise traces and connections between the electronic components and a functional lens. For example, conductive trace 210 may connect from an electronic component (not illustrated) connected along conductive trace 202 to an electrode ring 212 within the lens assembly. A detailed description of these electrically conductive traces 112 as well as methods for fabricating these conductive traces 112 is given in more detail subsequently. It is important to note that the plastic/polymer forming the contact lens 100 may comprise any suitable biocompatible material commonly utilized for this type of application.

Figure 3:
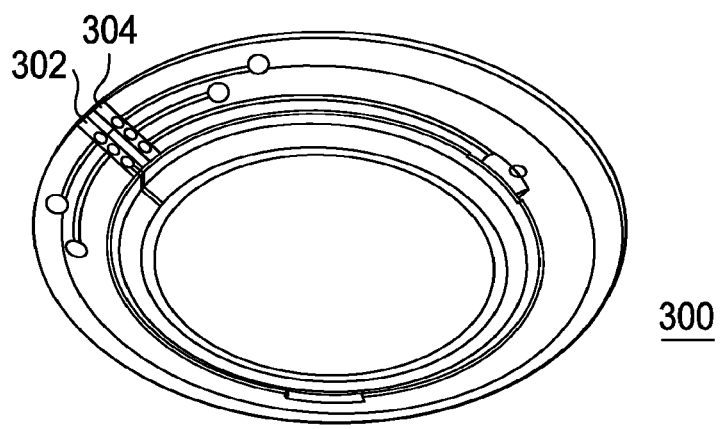
FIG. 3 is a diagrammatic representation of a second exemplary embodiment of conductive traces on an optic substrate in accordance with the present invention.

In an alternate exemplary embodiment, raised sections or ribs are utilized in place of standoffs. FIG. 3 illustrates an exemplary optic substrate 300 which has been manufactured and metalized for mechanical and electrical interconnects without any of the electronic components attached thereto. As illustrated, raised ribs 302 and 304 have been molded or machined into the optic substrate 300. As with the standoffs illustrated in FIG. 2, the raised ribs 302 and 304 may or may not be metalized. In the exemplary embodiment, the raised ribs 302 and 304 are metalized. These ribs 302 and 304 form a planar contact for the semiconductor die (not illustrated) or any other component to be attached to the substrate 302. In addition to allowing electrical connection and planar mechanical support for the die, the standoffs allow clearance between the die and the substrate which is useful for underfilling, a technique known in the relevant art, which improves die adhesion and interconnect reliability.

Figure 4:
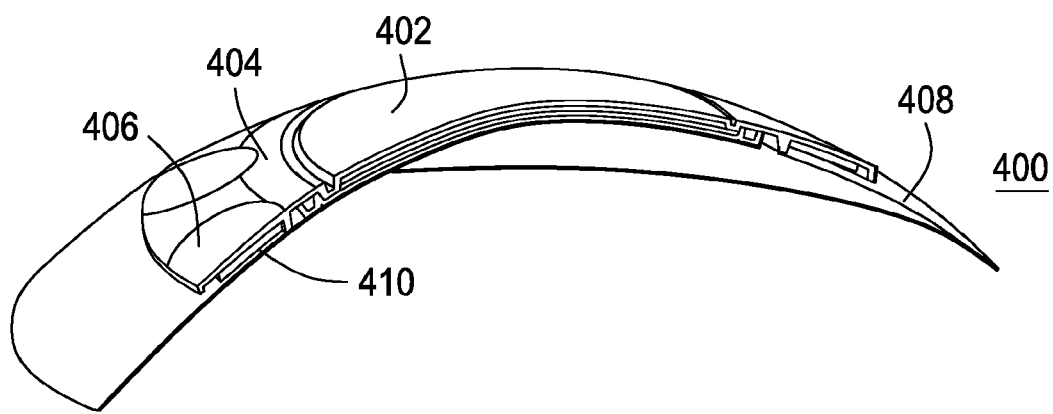
FIG. 4 is a diagrammatic representation of a third exemplary embodiment of conductive traces on an optic substrate in accordance with the present invention.

FIG. 4 illustrates yet another alternate exemplary embodiment for creating a planer interface between a spherical optic and a planar die. Assembly 400 is a complete contact lens 408 which includes a polymeric biocompatible material that is typically utilized in the manufacture of contact lenses. The lens optic 402 and electronic substrate 404 are similar to those illustrated in FIGS. 1 through 3 with the exception that planar relief 406 has been machined or molded into the polymer/plastic to create a suitable surface for the mounting and connection of a planar die 410. This technique may be combined with those explained herein, for example, utilizing standoffs to allow for underfilling.

Figure 5:
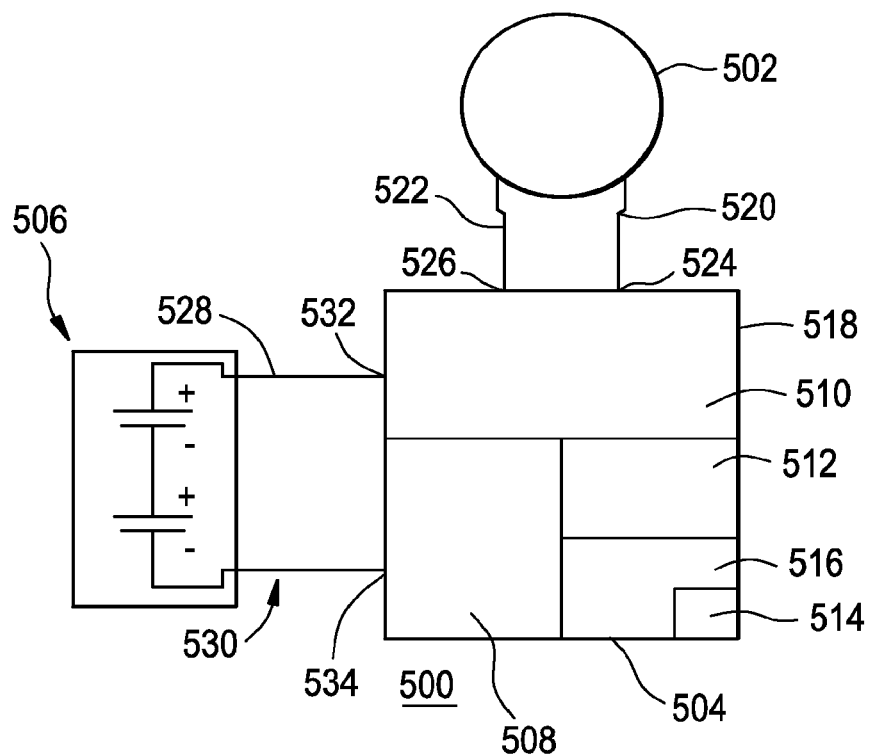
FIG. 5 is a diagrammatic representation of an exemplary electro-optic system in accordance with the present invention.

Referring now to FIG. 5, there is illustrated an exemplary electro-optic system 500 comprising an electro-active lens 502, an electronic control component 504 and a battery 506. While the battery 506 is illustrated as part of the system 500, it is important to note that alternate means may be utilized, including other storage devices, inductive powering devices and energy harvesting arrangements or configurations. In addition to the three main components, other functional blocks may be present in the system depending on the intended use. The electronic component 504 may be a semiconductor die containing multiple functional blocks. For example, block 508 may comprise a digital control system, block 510 may comprise a lens driver, block 512 may comprise a means to provide bias to the other circuits or functional blocks in the die 504, block 514 may comprise an optical sensor which is responsive to visible, infrared and/or other form of electromagnetic radiation, and block 516 may comprise an isolation region or circuitry which is not sensitive to photocurrent. If a photosensor is utilized, the region around the sensor may be left exposed, wherein an opaque light-blocking layer 518 may be utilized to shield the other circuitry from incoming or incident radiation. This is important because, as it is widely known in the electronics field, incident radiation may induce photocurrents in semiconductor circuits thereby leading to undesired effects. Conductive traces 520 and 522 connect the lens 502 to the electronic component 504 and conductive traces 528 and 530 connect the battery 506 to the electronic component 504. These conductive traces 520, 522, 528 and 530 may be realized in any number of suitable ways as described in more detail herein. Conductive traces 520 and 522 connect to the electronic component 504 via interconnects 524 and 526 respectively, and conductive traces 528 and 530 connect to the electronic component 504 via interconnects 532 and 534 respectively. The interconnects are also described in more detail herein.

Figure 6:
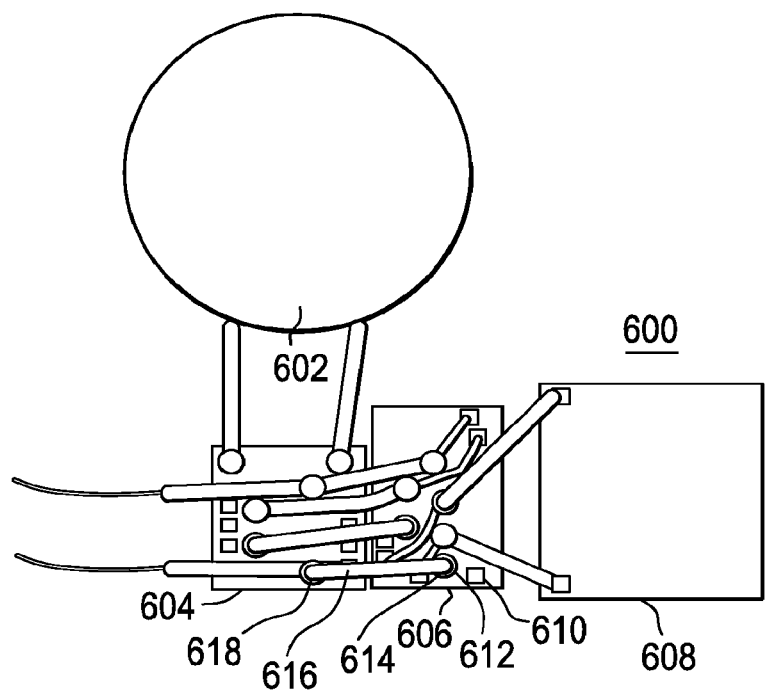
FIG. 6 is a diagrammatic representation of another exemplary electro-optic system in accordance with the present invention.

FIG. 6 is a diagrammatic representation of an exemplary electro-optic system 600 detailing the traces and interconnects. The exemplary electro-optic system 600 comprises a lens 602 and electronic components 604, 606 and 608. Traces and interconnects are also illustrated and are described below. In the illustrated exemplary embodiment, electronic component 604 comprises a semiconductor lens driver die, electronic component 606 comprises a microcontroller die and electronic component 608 comprises a photosensor die. A bondpad 610 is shown on the microcontroller die 606, as is common in the semiconductor industry. A redistribution layer or RDL (not illustrated) is applied to the die 606. This redistribution layer includes both conductive, metallic traces and an insulating dielectric. A new bondpad 614 is created with the redistribution layer. Conductive trace 612 is realized from the metallization in the redistribution layer and connects the native bondpad 610 to the redistribution bondpad 614. This redistribution is desired for a contact lens interconnection to increase the diameter of the interconnect and to place the interconnect in a specific, desired location. On the optical substrate, as illustrated in the previously described figures, a trace 616 connects from redistributed bondpad 614 to a similar redistributed bondpad 618 on component 604. Similar redistributive traces, bondpads and substrate traces as shown for connection between components 602 and 604, 606 and 608 and 604 and other components on the lens, not illustrated, for example a battery.

Figure 7:
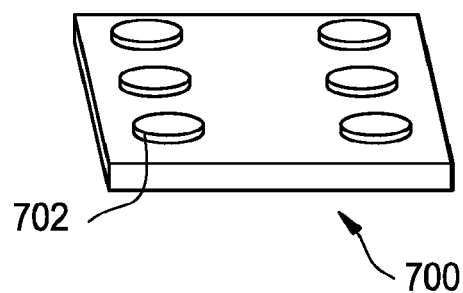
FIG. 7 is a diagrammatic representation of a top view of an exemplary die in accordance with the present invention.

FIG. 7 illustrates an exemplary die 700 onto which six interconnects, in the form of pillars 702, have been created.

As previously described, such pillars 702 may be added through a redistribution layer and may exist in locations other than those of the native bondpads, not illustrated in the figure. The pillars 702 may be created through a common practice in the redistribution industry, for example, through masking and physical vapor deposition (PVD) of metals like gold or copper. The pillars 702 may be manufactured for specific heights, for example, by varying the deposition time. All of the pillars may be designed to be coplanar, or some pillars may be made taller to follow the spherical contours of the substrate, not illustrated in this figure. The pillars 702 may be capped with special metallurgic coatings, for example, electroless nickel immersion gold, ENIG, to protect the interconnect from corrosion and promote acceptance of solder, or other platings as are common in the industry. The pillars 702 may also be capped with solder balls, not illustrated in this figure, or other materials to facilitate attachment.

Figure 10:
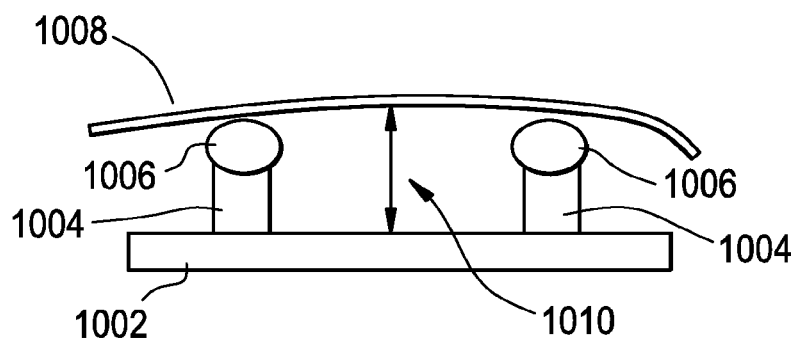
FIG. 10 is a diagrammatic representation of a side view of an exemplary die and interconnects in accordance with the present invention.

FIG. 10 illustrates the die 700 of FIG. 7 from another perspective. In this exemplary embodiment, pillars 1004 are fabricated on electronic component die 1002, which may be fabricated from any suitable material such as silicon. Bumps 1006 may be positioned on the pillars 1004. The bumps 1006 may comprise solder balls, conductive epoxy or any other suitable material. The height of the pillars 1004 and bumps 1006 allow the planar die 1002 to make mechanical and electrical connection with the spherical or non-planar substrate 1008. The pillars 1004 and bumps 1006 create a standoff height, illustrated by line 1010, which allows an underfill material to flow between the die 1002 and the spherical or non-planar substrate 1008, thereby forming a robust mechanical connection. The pillars 1004 and the bumps 1006 may be designed for creating a uniform height, or each combination may be uniquely designed to follow the contour of the spherical or non-planar substrate 1008. In an alternate exemplary embodiment, the bumps 1006 may be fabricated from a liquid, curable conductor. Such a liquid, curable conductor could bridge the gap between the pillars 1004 and the spherical or non-planar substrate 1008, especially if all of the pillars 1004 are of uniform height and the spherical or non-planar substrate 1008 is substantially curved. The volume or liquid, curable conductor dispensed onto a particular pillar 1004 and/or spherical or non-planar substrate may be precisely controlled to optimize height, cost, electrical and mechanical robustness.

Figure 8:
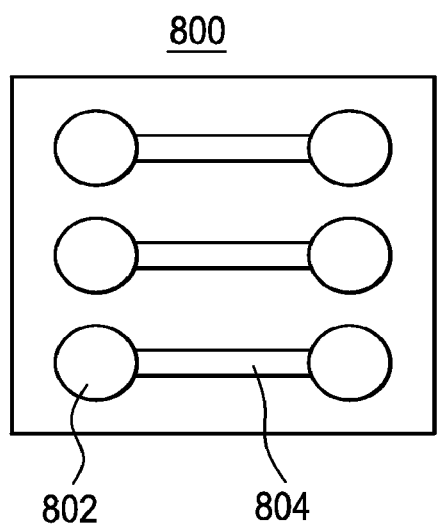
FIG. 8 is a diagrammatic representation of a mask in accordance with the present invention.

Referring now to FIG. 8, a mask design 800 is illustrated for an exemplary die. In this exemplary embodiment, a test die is created to facilitate interconnect "daisy chain" testing; however, the technique described herein may be applied to a functional die in a vision correcting or vision enhancing application such as a powered or electronic contact lens. One mask layer comprises only traces such as 804, with openings in the mask in the areas indicated. These openings in the mask allow physical vapor deposition metal to pass through the mask and accumulate on the die. Areas not opened are blocked and left uncoated by metal. Bondpad openings such as 802 are present on another mask layer, for example, to receive additional metallization or solder.

Figure 9A:
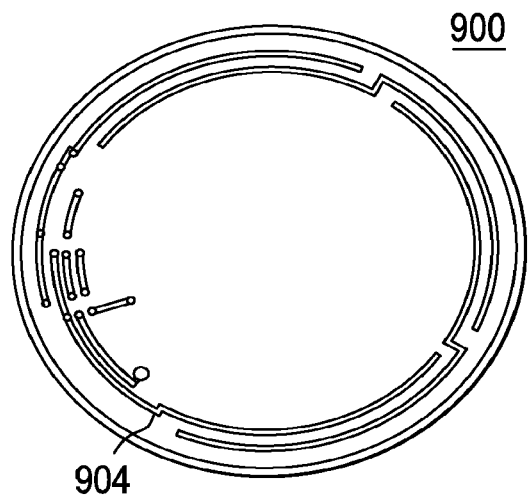
FIG. 9 is a top view and cross-sectional view of a mask in accordance with the present invention.
Figure 9B:
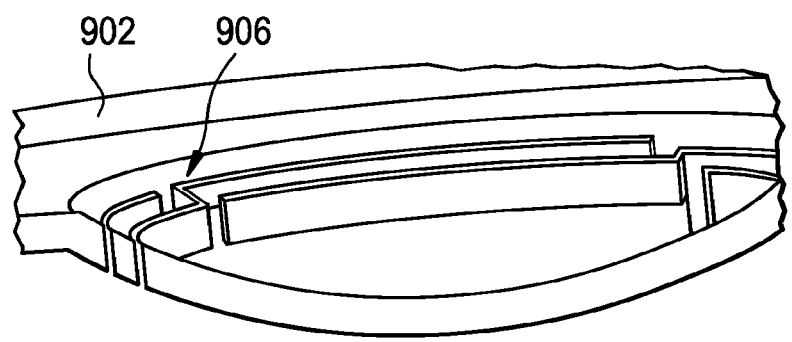

FIG. 9 shows a mask in both top view 900 and cross sectional view 902. Such a mask may be used to realize the metallization as shown in FIG. 2, for example. The mask 900 and 902 may be created from a material commonly used for physical vapor deposition masking, for example, stainless steel. Openings 904 and 906 in the mask permit metal to pass through the mask and collect on the substrate, as previously described. These openings may be machined with a technique suitable for the mask material and design, for example, laser etching. Cross section 902 illustrates a three dimensional mask suitable for metalizing a spherical surface. Such a mask may be created from a combination of customary and novel techniques, for example laser etching of a flat sheet of stainless steel followed by stamping into a spherical form. The openings may be specially designed to realize the desired geometry once formed into a spherical shape. Alternately, a flat mask may be used, with mask openings specially designed to realize the desired trace geometry once projected onto the spherical substrate in the physical vapor deposition or other metallization process.

The electrical interconnects and die attachments for use in a contact lens and/or for use in a powered ophthalmic as described herein must preferably overcome a number of difficulties or challenges as set forth below. Typical substrates for electrical interconnects are not of optical quality. Typical substrates for electrical interconnects are flat/planar and not for use or mounting on a spherical surface. These two challenges involve methods for creating traces on a spherical surface, attaching one or more planar dies to the surface and fixturing the contact lens insert for interconnect processing. Special fixturing may be required to fulfill high-volume production. Creating electrical traces and pads on a substrate typically involves metal plating, chemicals, and/or temperatures which may be harmful to optical-quality plastic. Die attachment typically involves high temperature, e.g. solder reflow at 250 degrees Celsius or epoxy curing at 100-200 degrees Celsius, and pressure which could be destructive to optical-quality plastic. Die and component attachment also typically involves chemical washing steps, e.g. flux removal, which may be harmful to optic plastic or leave residues which may require additional cleaning. Studs, solder balls, and other standoffs may add substantial height to the die. There is little available height, e.g. less than or equal to 130 µm, in a contact lens. Underfill and overmolding also typically add substantial height to the total packaged system. Overmolding of the electronic die should round off sharp edges for safety and to more easily accept additional coatings, and be compatible with additional coatings, e.g. silicone hydrogel, while still being thin. Underfill and overmolding should preferably also help the interconnects remain reliable with the typical stresses placed on a contact lens, for example, during insertion and removal. Probable assembly methods for an electronic contact lens may include submerging the assembled electronic module (substrate+die+battery) in saline, e.g. for assembly of the variable lens or when the final contact lens is hydrated and stored. This places moisture barrier requirements on the electronics packaging which are not typical. The contact lens may have a six year shelf life in a saline package. One exemplary approach metalizes the variable optic separate from the traces on the circuit board. In an alternate exemplary embodiment, one could use the same metallization process for both the traces and the variable optic, thereby reducing the number of process steps to create the metallization (potentially reducing cost and improving yield) and also reducing the need for an interconnect between the circuit board and variable optic lens. This may also apply to dielectric coatings required after the metallization. The electrical properties for use on a lens may not be as stringent as typical circuit boards. An exemplary electro-optic structure has approximately a two (2) giga ohm resistance. Higher resistances between traces may not be advantageous, or at least one may want to tradeoff current consumption with interconnect complexity. Likewise, because an electro-active lens may appear as a highly resistive load the lens connections may tolerate ohms or even perhaps hundreds of ohms of series resistance. Because the system is low-power, e.g. average current consumption of two (2) microamperes, one can tolerate higher trace resistance without dropping substantial voltage.

In one exemplary embodiment a single-die application-specific integrated circuit (ASIC) solution has an optical sensor on the die. This requires a light-passing area and also a light-blocking area on the active surface of the die, which is typically underfilled for flip chip attachment. Light blocking is required because light striking the die creates photocurrent which disrupts the circuit function, especially for circuits designed for low bias current (the induced photocurrent is larger relative to low bias currents.) The need for two separate die or space between the photosensor and other circuits on-die adds cost. Light blocking is also needed on the back side of the die, which is typically overmolded. Light blocking is also required around the edge of the die, which raises concerns for overall thickness and the typically sharp die edge.

Because it is desirable to reduce die area, for example, to maximize battery area and/or decrease the presence of visible components in the contact lens, a single die placement may be desired. If the system requirements, for example, current consumption, dynamic range and features, cannot be realized in the allocated die size with a single process node, die stacking may be utilized. Such techniques, as known in the relevant art, involve thinning the die, fixturing the die, and making thin electrical and mechanical connections between the die. Such a stacked-die assembly may then be attached to the optic substrate as a single device. Because it may also be desirable to make the electronic contact lens as transparent as possible, one may utilize components which conform to the spherical contact lens instead of remaining planar. To reduce the overall thickness of the contact lens, techniques to thin silicon die to the point where they pass light and become flexible may be utilized. Such techniques, as known in the art, involve fixturing and various thinning techniques. Circuits may also utilize alternate substrates, for example, thin glass or polymers, which may be flexible and/or transparent. Circuits may also be fabricated on a classical substrate like silicon, then attached to the optic substrate, then the classical substrate removed to reduce thickness. Circuits may also be realized directly on the optic substrate, then the classical substrate removed to reduce thickness. Circuits may also be realized directly on the optic substrate instead of a classic substrate like silicon.

The requirements for leachables coming out of the contact lens should preferably also be met. Electrical interconnects typically involve compounds which may be considered hazardous, e.g. copper, lead, and tin. The quantity of these materials should preferably be limited and/or employ barriers to ensure they do not leach out. The product must consider Design for Environment (DFE), Restriction of Hazardous Substances (RoHS), and similar requirements which promote sustainable manufacturing, responsible disposal, and reduction of hazardous materials, e.g. lead and mercury.

Typical electrical interconnects are small and numerous, and hence high-density, e.g. tens per square millimeter. Typical interconnects for flip chip are also intended for high-frequency signals, e.g. digital busses. Few interconnects are needed for some electronic contact lens applications (perhaps only four) at low frequency in approximately one square millimeter. It is preferable to optimize the interconnects for yield, reliability, and materials rather than density and signal frequency. It is preferable to make tradeoffs between the specifications on the optic plastic molding, e.g. adding a planar surface, adding interconnect studs or ribs, and the specifications on the die attachment, e.g. adding copper pillars and using liquid curable conductive epoxy to bridge gaps.

Typical die are designed with on-chip circuitry to mitigate the damaging effects of electrostatic discharge (ESD). The size of the circuits, and hence die size, typically increases with increasing immunity to ESD. These circuits may also adversely affect the current consumption of the electronic system. The current invention seeks to optimize the size of these circuits, leakage current, the die attach process, and the ESD-protective underfill and overmold in the contact of the electronic contact lens.

Batteries are typically packaged separately from electronic traces. To decrease solution size and combine process steps, thereby reducing cost, the current invention seeks to use the same interconnect traces as the current collectors for batteries deposited on the optical substrate. This likely places additional requirements on the traces, e.g. metallurgy and compatibility with anode and cathode materials. Due to the visibility on a user's or wearer's eye and the importance of eye-to-eye contact for human interaction, materials commonly utilized for conductive traces and other structures may be too reflective or opaque for acceptable contact lens aesthetics. Accordingly, alternate materials may be utilized to reduce the visibility of these components.

Accordingly, a number of methods may be utilized for creating and/or realizing conductive traces on optical plastic/polymer as well as die attachment in order to overcome the disadvantages set forth above. One method may comprise depositing then ablating. In this process, metal is deposited onto plastic then selectively removed to leave only the desired traces. Accuracy is required in the ablation, e.g. laser, and not the deposition. An alternate exemplary method comprises using a masked deposit. In this process metal is deposited with a mask to produce defined traces. The mask becomes challenging for a spherical surface. In another alternate exemplary method a liquid, curable conductor is utilized. In this process, the traces are printed utilizing a liquid ink/epoxy which cures to form a conductive trace, e.g. with commercially available equipment designed for precision dispensing. In still another alternate exemplary method, a contactless inductive approach may be utilized. In other words, create a connection between nodes with a transformer instead of an electrical connection. For an AC-drive variable lens, an antenna coil (secondary) on the lens could couple to a coil (primary) on the driver circuit. In yet another alternate method, specified fixturing and assembly equipment may be utilized. For example, specified fixtures may be utilized to handle optic substrates during deposition, etching and laser processing. In other words, specialized equipment may be designed to handle thin substrates during the assembly and electrical testing, e.g. automated probe station.

A number of methods may also be utilized for die attachment. Low-temperature solder, for example, $Bi_{44.7}Pb_{22.6}Ib_{19.1}Cd_{5.3}Sn_{8.3}$, or $Bi_{49}Pb_{18}Sn_{12}In_{21}$ may be utilized. Spot soldering may also be utilized. Instead of reflow which would expose the entire optic substrate to heat, a laser to heat only the solder joint may be utilized. Liquid, curable conductive epoxy is another alternate means for attachment. Conductive epoxy is widely used in die attachment. Problems with yield and reliability when using seventy-five (75) μm diameter pads with fifty (50) μm spacing (native bondpad spacing on a microcontroller) have been experienced. The small pads hold a small volume of epoxy, which makes weak connections. The tight spacing makes shorts likely between pads. In order to overcome this, one utilizes larger pads (150-250 μm diameter) with larger pitch (also greater than 150 μm) to avoid these problems. Photopatternable conductive polymer may also be utilized. Photopatternable conductive polymer may be used to coat plastic. Selective regions may be masked and etched to form traces using compatible ultraviolet wavelength. Anisotropic conductive film offers another exemplary alternate means. Anisotropic conductive film uses conductive particles suspended within a dielectric tape or deposited film. The interconnects are made under pressure and heat. Typical conductive film may require a temperature around 200 degrees Celsius and a pressure of 100 MPa which may be problematic. Ultrasonic/thermosonic methods for forming interconnects may be utilized. Direct metal/metal interconnects may be made with ultrasonic energy, temperature, and pressure. Gold stud bumps provides yet another alternate means. Gold stud bumps are common with conductive epoxy attachment. They may be problematic in the current application due to cost and diameter. They are typically one (1) mil in diameter (25 µm, before coining) but the pads could be 150-250 µm. Multiple stud bumps on an interconnect pad may be utilized. Copper pillars may also be utilized. Copper pillars, perhaps ones that are nickel-gold plated, could be used to standoff the die from the optic. Pillars may have low melt solder terminations to form connections to the pads on the plastic. This may permit the die and optic to be hot for a small duration of time, thereby substantially reducing the chance of damaging the optic. Standoffs on the optic provide another alternative. Plastic standoffs could be molded into the optic as studs, ribs, or planes. Conductive traces could then be added, including the standoffs. Such standoffs in the molded plastic add to molding complexity. Standoffs could be designed to wedge against certain features on the die creating interconnects which do not require epoxy or solder. Molded plastic parts could also have flexible features which allow the die to be clipped into location, where the flexible features load the die down against its bondpads. Focused Ion Beam (FIB) technology may be utilized. Focused Ion Beam technology slowly builds metal or insulator or insulated metal traces by implanting conductor and insulator ions. Focused Ion Beam technology may be used to etch any unwanted metal or insulator in small regions. Die stacking then attach to optic offers another alternate means. To realize higher density, one may use classical die stacking techniques, e.g. high density, high speed, solder balls and through-silicon vias to attach memory to a processor, and then attach that module to the optic substrate using a novel low temperature approach. Specialized fixturing may be utilized. One could create a special fixture to hold the spherical substrate in a die attachment workstation or production line available in this industry. Redistribution layer techniques may be utilized. Redistribution layer techniques add a layer on top of the native die bondpads, typically 75 µm diameter and tightly spaced, to yield larger bondpads, e.g. 150-250 µm, which are spaced father apart. Connections may also be made between nodes to reduce the total number of pads.

A number of methods may also be utilized for underfilling, overmolding and light blocking. Standard underfill may be utilized; however, it typically blocks light and may have a high cure temperature and/or long cure time. Optically clear underfill may be utilized which passes light, but may still have a high cure temperature and/or long cure time and may have compromises relative to standard underfill. A tradeoff exists between typical underfill cure time and temperature. This tradeoff may be exploited to permit curing at lower temperature or alternately, undefills with lower cure temperature may be utilized. A window insert may be utilized. Such a window insert could be placed between the die and substrate, allowing for interconnects transparent and opaque regions. Thick metal on IC may be utilized. Thick metal may be added as a process option with the top layers of the IC to block light. A light-blocking layer on IC may be utilized. Additional light-blocking layers may be added to the top of the die. Standard overmold may be utilized. Standard overmold may be too thick. Paint overmold may be utilized. Paint may be used to coat the backside of the die. Parylene coating may be utilized. Parylene may be used to insulate the die, traces, and interconnects. Silicone coating may be utilized. Silicone may be used as an overmold, perhaps in conjunction with other materials. It may also serve as an oxygen reservoir, which may be useful for contact lens biocompatibility.

The overall manufacturing process may simply include the following: mold optic plastic substrate/front optic; separately mold back optic; metalize substrate; attach die; underfill/overmold die; deposit battery; parylene coat; assemble liquid lens and attach black optic; apply additional insulation/sealing/coating; silicone encapsulation; hydrogel molding or free-forming/hydrate lens; disinfect lens; package in solution; store; activate and use; and finally dispose.

Although shown and described is what is believed to be the most practical and preferred embodiments, it is apparent that departures from specific designs and methods described and shown will suggest themselves to those skilled in the art and may be used without departing from the spirit and scope of the invention. The present invention is not restricted to the particular constructions described and illustrated, but should be constructed to cohere with all modifications that may fall within the scope of the appended claims.

What is claimed is:

1. An ophthalmic lens assembly comprising:
a non-planar substrate;
a lens section formed in the non-planar substrate; and
one or more electronic components cooperatively associated with the lens section and mounted on the non-planar substrate, wherein one of the non-planar substrate and the one or more electronic components comprise mechanical mounting structures, configured to facilitate mounting planar structures to non-planar surfaces, and electrical interconnect structures for mounting the one or more electronic components to the non-planar substrate.

2. The ophthalmic lens assembly according to claim 1, wherein the non-planar substrate comprises an optical grade plastic.

3. The ophthalmic lens assembly according to claim 1, wherein the mechanical mounting structures comprise one or more stand-offs formed on the non-planar substrate, the one or more stand-offs being variably sized to create a planar mounting substrate for the one or more electronic components.

4. The ophthalmic lens assembly according to claim 3, wherein at least one of the one or more stand-offs are at least partially coated with a conductive material.

5. The ophthalmic lens assembly according to claim 1, wherein the mechanical mounting structures comprise one or more stand-offs formed on the one or more electronic components, the one or more stand-offs being variably sized to create a non-planar mounting surface for mounting the one or more electronic components to the non-planar substrate.

6. The ophthalmic lens assembly according to claim 5, wherein at least one of the one or more stand-offs are at least partially coated with a conductive material.

7. The ophthalmic lens assembly according to claim 1, wherein the mechanical mounting structures comprise one or more raised structures formed on the non-planar substrate, the one or more raised structures being variably sized to create a planar mounting substrate for the one or more electronic components.

8. The ophthalmic lens assembly according to claim 7, wherein at least one of the one or more raised structures are at least partially coated with a conductive material.

9. The ophthalmic lens assembly according to claim 1, wherein the mechanical mounting structures comprise one or more raised structures formed on the one or more electronic components, the one or more raised structures being variably sized to create a non-planar mounting surface for mounting the one or more electronic components to the non-planar substrate.

10. The ophthalmic lens assembly according to claim 9, wherein at least one of the one or more raised structures are at least partially coated with a conductive material.

11. The ophthalmic lens assembly according to claim 1, wherein the mechanical mounting structures comprise one or more planar reliefs formed in the non-planar substrate, the one or more planar reliefs being variably sized to create a planar mounting substrate for the one or more electronic components.

12. The ophthalmic lens assembly according to claim 11, wherein at least one of the one or more planar reliefs are at least partially coated with conductive materials.

13. The ophthalmic lens assembly according to claim 1, wherein the electrical interconnect structures comprise traces affixed to the non-planar substrate, the traces being formed from a conductive material.

* * * * *